United States Patent [19]

Kazarinov et al.

[11] Patent Number: 4,488,164
[45] Date of Patent: Dec. 11, 1984

[54] QUANTIZED HALL EFFECT SWITCHING DEVICES

[75] Inventors: Rudolf F. Kazarinov, Martinsville; Sergey Luryi, New Providence, both of N.J.

[73] Assignee: AT&T Bell Laboratories, Murray Hill, N.J.

[21] Appl. No.: 387,227

[22] Filed: Jun. 10, 1982

[51] Int. Cl.³ .................. H01L 27/22; H01L 25/04; H01L 45/00; H01L 29/82

[52] U.S. Cl. .................. 357/27; 357/83; 357/2; 357/4; 307/309

[58] Field of Search .............. 357/83, 27, 2, 4; 307/309

[56] References Cited

U.S. PATENT DOCUMENTS

| | | | |
|---|---|---|---|
| 3,196,282 | 7/1965 | Ittner | 307/309 |
| 3,303,427 | 2/1967 | Esaki | 307/309 |
| 3,763,407 | 10/1973 | Yazawa | 357/27 |
| 4,398,342 | 8/1983 | Pitt et al. | 357/27 |

OTHER PUBLICATIONS

P. W. Shackle, "Measurement of the Hall Coefficient in Liquid Metals by the Corbino Method," *Phil. Mag.*, Ser. 8, vol. 21, 1970, pp. 987–1002.

D. C. Tsui et al., "Zero-Resistance State of Two-Dimensional Electrons in a Quantizing Magnetic Field," *Physical Review B*, vol. 25, No. 2, Jan. 15, 1982, pp. 1405–1407.

S. Kawaji "Quantum Galvanomagnetic Experiments in Silicon Inversion Layers Under Strong Magnetic Fields," *Surface Science*, vol. 73, 1978, pp. 46–69.

D. C. Tsui et al., "Resistance Standard Using Quantization of the Hall Resistance of GaAs-Al$_x$Ga$_{1-x}$As Heterostructures," *Applied Physics Letters*, vol. 38, Apr. 1, 1981, pp. 550–552.

K. V. Klitzing et al., "New Method for High-Accuracy Determination of the Fine-Structure Constant Based on Quantized Hall Resistance," *Physical Review Letters*, vol. 45, No. 6, Aug. 11, 1980, pp. 494–497.

*Primary Examiner*—Martin H. Edlow
*Assistant Examiner*—Jerome Jackson, Jr.
*Attorney, Agent, or Firm*—David I. Caplan

[57] ABSTRACT

A switching element (e.g., 30) is furnished by an inversion layer (e.g., 55) in a zero resistance state under the influence of a quantizing magnetic field, the inversion layer having a ring geometry. Voltage (e.g., V$_o$) applied across a pair of localized spaced apart terminals (e.g., 37, 38)—one on a portion of the inner edge of the ring, the other on the outer edge—produces a percolating current in the inversion layer, that is, a current circulating around the ring in a zero resistance state. This percolating current suddenly vanishes when a control voltage is applied to an auxiliary (gate) electrode (e.g., 51), whereby an output voltage (e.g., V$_{out}$) previously developed across another pair of localized spaced apart terminals (e.g., 47, 48) on either edge of the ring suddenly also vanishes.

14 Claims, 19 Drawing Figures

QUANTIZED HALL EFFECT SWITCHING DEVICES

FIELD OF THE INVENTION

This invention relates to solid state electrical switching devices, and more particularly to quantized Hall effect switching devices.

BACKGROUND OF THE INVENTION

In a paper entitled "New Method for High-Accuracy Determination of the Fine-Structure Constant Based on Quantized Hall Resistance," published in *Physical Review Letters*, Vol. 45, pp. 494–497 (1980), K. v. Klitzing, G. Dorda, and M. Pepper showed that the Hall resistance of a two-dimensional electron gas, formed at the inversion layer at an interface of silicon and silicon dioxide in a metal-oxide-semiconductor field-effect transistor configuration, is quantized when this resistance is measured at liquid helium temperatures in a magnetic field of the order of 15 Tesla (150 kilogauss). By "quantized" is meant that the Hall resistance would take on certain values corresponding to Hall conductivities which were proportional to the product of the fine structure constant (approximately 1/137) and the speed of light.

In a subsequent paper entitled "Resistance Standard Using Quantization of the Hall Resistance of GaAs-$Al_xGa_{1-x}As$ Heterostructures," published in *Applied Physics Letters*, Vol. 38, pp. 550–552 (1981), D. C. Tsui and A. C. Gossard demonstrated that a two-dimensional electron gas at a heterojunction interface—specifically an interface between gallium arsenide and aluminum gallium arsenide—at sufficiently low temperatures and under sufficiently high magnetic fields perpendicular to the interface, similarly evinced quantized resistivities.

Figure 1:
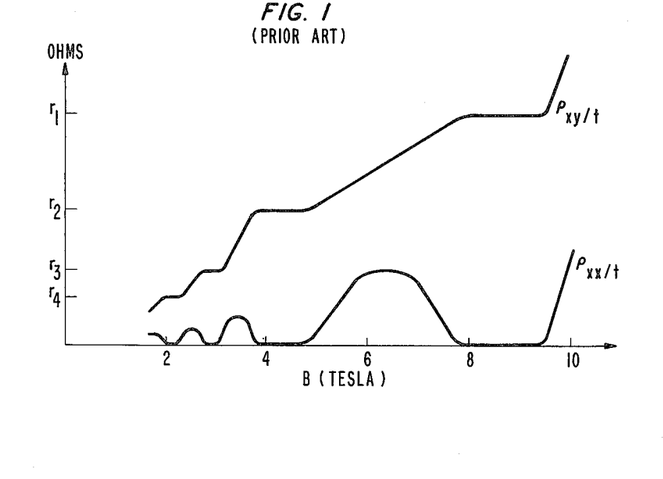
FIG. 1 is a graphic plot of resistivity versus magnetic field, exhibiting the quantized Hall effect in accordance with prior art.

More specifically, as indicated in FIG. 1, Tsui and Gossard showed that the longitudinal or ohmic electrical resistivity ($\rho_{xx}$) of the inversion layer at the heterojunction interface of a sample structure of GaAs-$Al_{0.3}Ga_{0.7}As$ at 4.2° K. exhibited minima (as a function of magnetic field) equal to substantially zero resistivity (less than 0.1 ohms per square) at magnetic fields of 4.2 and 8.4 Tesla, and that the transverse or Hall resistivity ($\rho_{xy}$) exhibited stationary (quantized) values ($r_1, r_2, r_3, r_4, \ldots$) under these magnetic fields.

Figure 2:
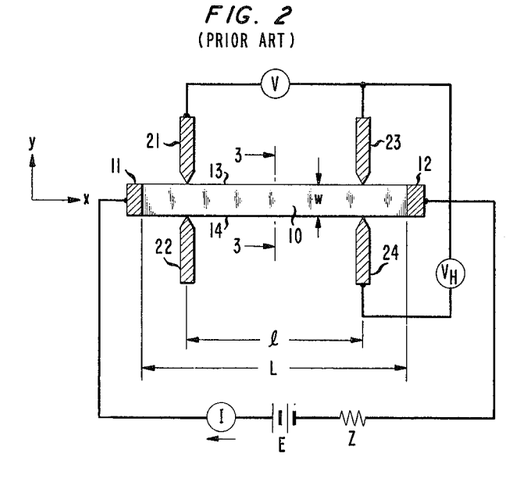
FIG. 2 is a top view diagram, partly in cross section, of a circuit for measuring the quantized Hall effect in accordance with prior art.
Figure 3:
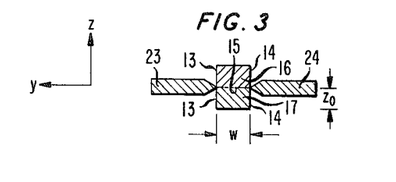
FIG. 3 is a section of a portion of FIG. 2.

FIG. 2 illustrates an example showing how to measure these resistivity effects. As shown in FIG. 2, a source of an electrical current I is furnished by a battery of electromotive force E connected in series with a high impedance Z. The current I is supplied to the electrode contacts 11 and 12 located on opposite ends of a solid rectangular rod or bar 10 of width w and thickness t, and having a side edge 13 and an opposite side edge 14. The resistance of the impedance Z is sufficiently high that during operation the current I is essentially constant. The bar is oriented with w parallel to the y-direction and t parallel to the z-direction (perpendicular to the plane of the drawing). An inversion layer is formed at a heterojunction interface 15 (FIG. 3) between top and bottom portions 16 and 17 of the rod. The heterojunction interface 15 extends at constant $z=z_o$ all the way along a cross section of the rod 10 between the electrode contacts 11 and 12. Each of electrodes 21 and 22 of first pair of electrical probes is located in contact with the bar 10 at $z=z_o$ and at the same x coordinates, and each of electrodes 23 and 24 of a second pair of electrical probes is located in contact with the bar at $z=z_o$ and at the same x but at a distance l measured along the x-direction away from the first pair of probes 21 and 22. A uniform steady magnetic field B is applied to the bar parallel to the z-direction. As a result of the applied voltage E, a current I flows through the bar along the x-direction; as a result of the magnetic field B, a Hall effect voltage is developed across the bar 10 in the y-direction. More specifically, the voltage or potential difference V between probes 21 and 23 (or between probes 22 and 24) is measured by a voltmeter of extremely high impedance, that is, a voltmeter which draws negligible current as compared to I. Likewise, the voltage between probes 23 and 24 (or between probes 21 and 22) is also measured by a voltmeter of extremely high impedance. Accordingly, essentially no current flows in the y-direction once equilibrium is established in the bar 10 under the applied voltage E.

In accordance with the definition of the ohmic resistance R of the bar 10:

$$R = V/I \tag{1}$$

On the other hand, the x-component $E_x$ of electric field in the bar 10 is equal in magnitude to V/l; and the x-component $j_x$ of the electrical current density is equal to I/wt. Accordingly, the longitudinal resistivity $\rho_{xx}$, defined in this case as $E_x/j_x$, is given by:

$$\rho_{xx} = (V/l)/(I/wt)$$

or $$\rho_{xx}/t = R(w/l) = (V/l)(w/l) \tag{2}$$

Accordingly, the quantity ($\rho_{xx}/t$) can be obtained from measurements of V, I, w, and l. The quantity ($\rho_{xx}/t$) is called the "sheet resistivity" and thus has the same dimensions as resistance, i.e., ohms.

Moreover, as indicated above, because of the presence of the magnetic field B in the z-direction, the Hall voltage $V_H$ is developed across the width w of the bar 10, as measured across the probes 23 and 24. The corresponding Hall resistance is given by $$R_H = V_H/I \tag{3}$$

Accordingly, the Hall resistance $R_H$ of the bar 10 can be formed by measurements of $V_H$ and I.

On the other hand, the y-component $E_y$ of the electric field in the bar 10 is equal in magnitude to $V_H/w$. The transverse or Hall resistivity $\rho_{xy}$, defined in this case as $E_y/j_x$, is thus given by:

$$\rho_{xy} = (V_H/w)/(I/wt)$$

or $$\rho_{xy}/t = R_H = V_H/I \tag{4}$$

Accordingly, $\rho_{xy}/t$ is the transverse or Hall "sheet resistivity" and also has the dimensions of ohms.

In the aforementioned paper by D. C. Tsui and A. C. Gossard, in *Applied Physics Letters*, Vol. 38, ($\rho_{xx}/t$) and ($\rho_{xy}/t$) were found to behave as indicated in FIG. 1; that is, $\rho_{xx}/t$ has zeros at certain values of magnetic field B, and $\rho_{xy}/t$ has (quantized) plateaus ($r_1, r_2, r_3, \ldots$) at these values of the magnetic field B. In this sense, $\rho_{xy}/t$ is said to be "quantized."

More specifically, these quantized values of resistivity have been found to satisfy the relationships:

$$r_1 = h/2e^2$$

$$r_2 = h/4e^2$$

$$r_3 = h/6e^2$$

$$r_4 = h/8e^2 \qquad (5)$$

where h is Planck constant and e is the charge on the electron. The existence of these quantized values of Hall resistivity has been shown to imply the existence of long range order in a two-dimensional electron gas. More specifically, these quantized Hall resistivities imply the existence of nonlocalized quantized states corresponding to quantum Landau levels whose wave functions extend over macroscopic distances in the inversion layer, that is, electronic states characterized by significant probability of finding an electron in the inversion layer at differing locations separated by distances typically as large as the order of millimeters. Thus far, the only important practical use of this quantized Landau level effect has been a method for accurate measurement of the value of $h/e^2$ and hence of the fine structure constant, $e^2/2\epsilon_0 hc = 1/137$, approximately, where $\epsilon_0$ is the permittivity of the vacuum and c is the speed of light. On the other hand, it would be desirable if this phenomenon of quantized Hall resistance, with its zero resistance state, could be used as a basis for switching elements and logic gates having relatively high switching speeds and low switching power-delay products.

SUMMARY OF THE INVENTION

A quantized Hall effect switching element is formed by an inversion layer, in a closed loop (annular ring) geometry configuration, having a first pair of spaced apart terminals contacting opposing first portions of, respectively, inner and outer edges of the ring to establish a voltage across said terminals, and hence across said first portions of the inner and outer edges, said inversion layer being subjected to a sufficient magnetic field and being maintained at a sufficiently low temperature that electrons can percolate around the ring in a zero resistance state, whereby an output voltage appears across a second pair of terminals contacting opposing second portions, respectively, of said inner and outer edges removed from said first portions, and said output voltage vanishes if and only if an input voltage is applied to a gate electrode located in a neighborhood of said inversion layer which is removed from said first and second portions. More specifically, the magnetic field is adjusted to a value at which the longitudinal resistivity substantially vanishes. Accordingly, virtually no power is then being consumed by the percolation of electrons around the ring.

In the absence of input voltage, it is believed that the electrons in the inversion layer form a two-dimensional gas of electrons circulating ("percolating") around the ring in orbits corresponding to nonlocalized (extended) quantum Landau levels or states, as described more fully in the Appendix; whereas in the presence of the input voltage, the nonlocalized levels are broken up into localized states, and the electrons no longer percolate around the ring but circulate in localized orbits associated with these localized states. By "nonlocalized" orbit (or "extended" orbit) is meant that the orbit percolates around the entire ring, the term "orbit" signifying paths or regions characterized by significant (quantum mechanical) probability that the electron will be found in such regions. When the input signal attains a certain value, no nonlocalized (percolating) Landau states can exist any longer, all orbits become localized (nonpercolating), and the output voltage suddenly vanishes.

During logic operations, in the absence of sufficient input voltage signal, the electrons thus percolate in the nonlocalized Landau levels around the ring, and the output voltage is then equal to a nonvanishing fixed value. If and when the input signal attains a sufficient ("critical") value, the output voltage thus suddenly vanishes. At intermediate values of input signal, the output voltage remains at the same (nonvanishing) fixed value. Thus the output voltage can serve as an output signal that is representative of the state (percolating vs. nonpercolating) of the switching element.

It is believed that the sudden switching in this invention—i.e., the vanishing of the output voltage—will occur with very small power-delay product and hence very small energy dissipation, typically as low as $10^{-20}$ joule per switching, and with a very small switching time, typically as low as a few picoseconds. Similarly, when the input signal voltage is removed, the percolating current will be re-established within a similarly short switching time, and the output (signal) voltage will thus be restored similarly quickly. It is further believed that during the time intervals when the input signal voltage is zero or is increasing to its critical value, but before it attains the critical value, electrons in quantized nonlocalized Landau states percolate around the ring in such a manner as to maintain the output voltage with negligible power dissipation. For example, at a temperature of about 4.2° K., a power of the order of only about $10^{-8}$ watts per switching element is expected to be dissipated even when current is percolating around the ring.

The effect of a voltage applied to the gate electrode to interrupt the percolating current flow in the annular ring in the practice of this invention is to be sharply distinguished from the effect of a voltage applied to interrupt the current in a conventional insulated gate field effect transistor (FET). In the case of the field effect transistor, the current is interrupted (transistor turns OFF) when the applied gate voltage is sufficient to interrupt the inversion layer so that the inversion layer no longer extends from source to drain as it did when the transistor was conducting current (i.e., when it was ON). In the device element of this invention, by contrast, during operation the inversion layer (as opposed to the percolating current) always extends all the way around the annular ring; that is, regardless of whether the device is in the ON or OFF state, the inversion layer is never interrupted.

Instead of interrupting the inversion layer as in the conventional FET, the device of the present invention turns OFF when the voltage applied to the gate electrode suppresses percolation of electrons around the ring in nonlocalized Landau levels even though the inversion layer is still maintained all the way around the ring. Indeed the voltage applied to the gate electrode for turning OFF the percolating current in this invention can be of the opposite polarity from that of the gate voltage required for turning OFF a corresponding conventional FET.

Rather than operating by interrupting the inversion layer, it is believed that the device of this invention thus turns OFF when the voltage applied to the gate electrode is sufficient to drive all the equipotentials, along which the nonlocalized Landau states otherwise would be percolating, out of the inversion layer (at least in the neighborhood of the gate electrode); so that no longer is there any Landau state with a corresponding percolating electron orbit defined, that is, confined within the inversion layer all the way around the ring, every (percolating) Landau electron orbit being characterized by circulation around the ring centered along an equipotential line, that is, the intersection of an equipotential surface with the plane of the inversion layer (considered as having negligible thickness). Thus, the turning OFF of the device in this invention is believed to result from the forcing of all equipotentials associated with Landau states orbits out of the inversion layer at least in the neighborhood of the gate electrode, and hence the OFF state results from the interruption and destruction of all nonlocalized (percolating) orbits in the inversion layer, the inversion layer itself remaining completely intact and uninterrupted.

BRIEF DESCRIPTION OF THE DRAWING

This invention can be better understood from the following detailed description when read in conjunction with the drawing in which.

Only for the sake of clarity, none of the drawings is to any scale.

DETAILED DESCRIPTION

Figure 4:
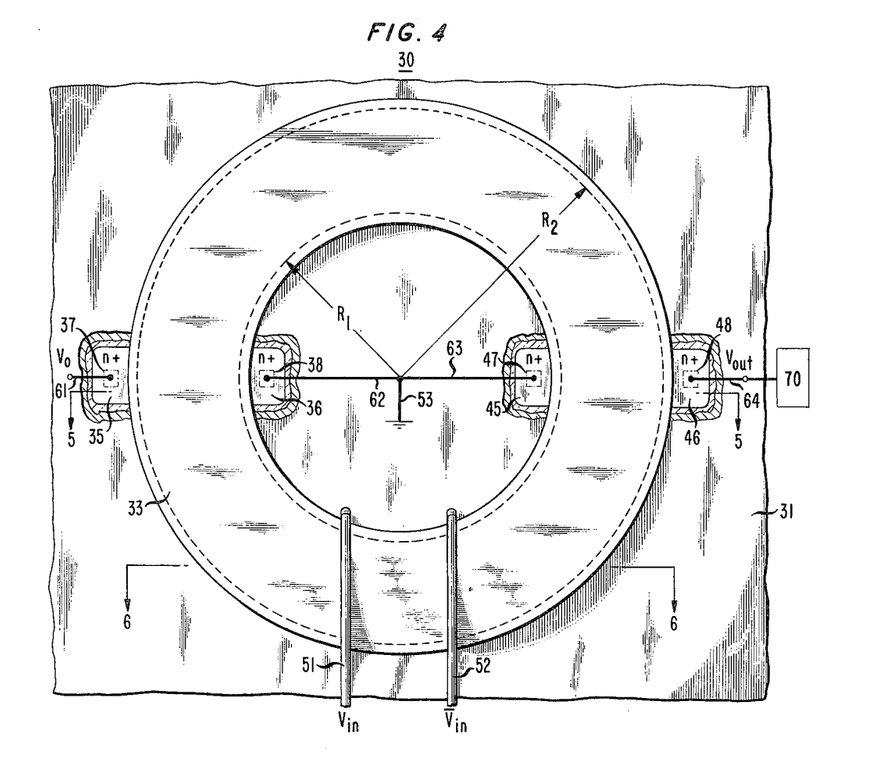
FIG. 4 is a top view diagram of a quantized Hall effect switching element, in accordance with a specific embodiment of the invention.

A switching device element 30 in accordance with a specific embodiment of the invention is shown in FIG. 4. Here, illustratively, a single crystal p-type gallium arsenide body 31 serves as a base for the epitaxial growth of, and mechanical support for, ring-shaped epitaxial layers 32 and 33 of gallium aluminum arsenide and silicondoped gallium aluminum arsenide, respectively. More specifically, the body 31 is 0.5 mm thick, with a uniform concentration of acceptor impurities of typically about $10^{15}$ or less per $cm^3$; the layer 32 is essentially $Ga_yAl_{1-y}As$ having a thickness d of typically about 100 Å, and a mole fraction y ordinarily in the approximate range of 0.25 to 0.40, typically about 0.30, and a uniform concentration of donor impurities of typically about $10^{15}$ or less per $cm^3$; and the layer 33 is essentially $Ga_xAl_{1-x}As$ doped with silicon, with a thickness of typically about 600 Å, a mole fraction x ordinarily in the approximate range of 0.25 to 0.40, typically about 0.30, and a uniform concentration of donor impurities of typically about $3 \times 10^{18}$ per $cm^3$. The epitaxial layers 32 and 33 are typically grown by molecular beam epitaxy, followed by selective masking and etching—as with a mask of silicon dioxide and solution etching with a solution of about 3 parts (by volume) sulphuric acid, 1 part hydrogen peroxide, and 1 part water—to form a circular ring geometry on the body 31. The ring has an inner edge radius $R_1$, typically of about 10 micron, and an outer edge radius $R_2$, typically of about 15 micron. It should be understood, however, that the ring need not be circular and that any closed loop configuration can be used. At the interface of the epitaxial layer 32 with the top surface 31.5 of body 31, an inversion layer 55 naturally forms in a region of the body 31 contiguous with this interface in the configuration of an annular (planar) ring. This inversion layer forms in response to the internal electric field produced, inter alia, by the silicon in the epitaxial layer 33. Ordinarily for this purpose of establishing the inversion layer 55 in this illustrative example, the concentration of silicon in this layer 33 is in the approximate range of $10^{18}$ to $5 \times 10^{18}$ per $cm^3$, typically about $3 \times 10^{18}$ per $cm^3$.

Figure 5:
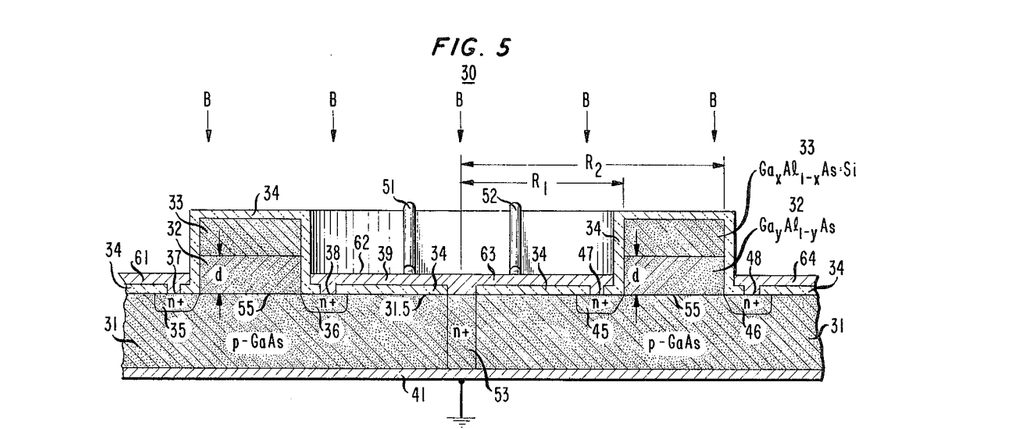
FIGS. 5 and 6 are cross sections of portions of the switching element shown in FIG. 4.

As further indicated in FIGS. 4 and 5, the device 30 also includes a first pair of $n^+$ localized zones 35 and 36 located contiguous with the top surface 31.5 of the body 31 and contiguous with the outer and inner edges, respectively, of the inversion layer 55 at a first portion of the ring, as well as a second pair of $n^+$ localized zones 45 and 46 located at the top surface of the body at a second portion of the ring removed from the first portion thereof. The term "portion" in this context refers, for example, to an angular sector of the ring.

A ground plane 41 contacts the entire bottom surface of the body 31, and a deposited silicon dioxide layer 34 contacts the top of the device 30, including the exposed portion of the top surface 31.5 of the body 31, the side surfaces of the epitaxial layers 32 and 33, and the top surface of the epitaxial layer 33. Apertures are formed in this silicon dioxide layer 34 at areas where electrode contacts 37, 38, 47, and 48 are made, respectively. Thus electrically conducting metallization layer 61 contacts the $n^+$ zone 35 via electrode contact 37, electrically conducting metallization layer 62 contacts the $n^+$ zone 36 via electrode contact 38, electrically conducting metallization layer 63 contacts the n+ zone 45 via electrode contact 47, and electrical conducting metallization layer 64 contacts the n+ zone 46 via electrode contact 48. In addition, the common merger portion of the conducting layers 62 and 63 contact an n+ zone 53 running from the top surface 31.5 of the body 31 to the ground plane 41 on the bottom surface, in order to furnish an electrical ground for the n+ zones 36 and 45. It should be noted that the n+ zone 45 can be omitted, since during operation the inside edge of the ring becomes an equipotential surface. As another alternative, the n+ zone 36 can extend all around the inside edge of the ring, or can extend even throughout the entire portion of the surfaces 31.5 located within the area encompassed by the inner circle $R_1$ so that the metallization layers 62 and 63 then can take the form of a single layer in the shape of a solid circular disc.

Figure 6:
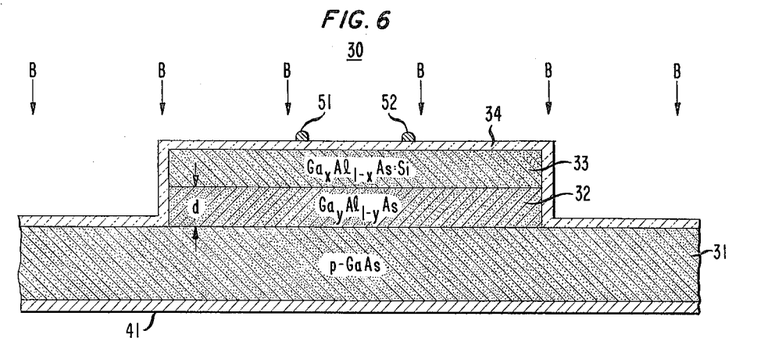

The silicon dioxide layer 34 can be deposited, to a thickness of typically about 1,000 Å, by conventional plasma or chemical vapor deposition, followed by conventional selective masking and etching to form apertures in the silicon dioxide for the electrode contacts 37, 38, 47, and 48. The n+ zones can then be formed by alloying gold with a donor impurity, such as tin or germanium. The electrical conducting layers 61, 62, 63, and 64 can all be simultaneously formed by deposition of gold, followed by selective masking and etching to form the desired metallization stripe geometry for interconnection with device elements or power supplies. In addition, as indicated in FIGS. 4 and 6, first and second insulated gate electrode layers 51 and 52 are also formed, ordinarily simultaneously with the metallization layers 61, 62, 63, and 64. Alternatively, Schottky barrier electrode contacts to the epitaxial layer 33 can be used instead of the insulated gate electrode layers 51 and 52.

During operation of the device 30, a supply voltage of $V_o$ is applied to metallization layer 37 in the presence of a magnetic field B. Illustratively, the supply voltage $V_o$, applied to metallization 61 and hence to n+ zone 35, is about 0.05 volts; the magnetic field B is about 9 Tesla directed perpendicular to plane of FIG. 4; and the ambient temperature T is aout 4° K. An output voltage $V_{out}$ equal to $V_o$ is developed and detected at the metallization layer 64 for use by utilization means 70. Upon application of sufficient input voltages $V_{in}$ and $\overline{V}_{in}$, respectively, each different from zero, to gate electrodes 51 and 52, the output voltage $V_{out}$ suddenly drops, i.e., switches to zero (i.e., ground). Conversely, $V_{out}$ suddenly returns to $V_o$ when the voltages $V_{in}$ and $\overline{V}_{in}$ return to zero (or float). Input voltages $V_{in}$ and $\overline{V}_{in}$ should be selected, for beneficial operating margins, to satisfy $V_{in} = -\overline{V}_{in}$; but this is not essential and other relative values for these voltages can be used. Moreover, the second gate electrode 52 (and hence $\overline{V}_{in}$ as well) may be completely omitted, at some possible sacrifice of margins of operation and of reliability of switching. In such a case the input voltage signal $V_{in}$ can be of either polarity and of the order of $V_o$ in magnitude.

It should be recognized that the device 30 can function as an inverting logic element. Specifically, when the input signal $V_{in}$ is sufficiently "high", i.e., binary digital "1", the output voltage $V_{out}$ is at ground potential or "low", i.e., binary digital "0"; and when the input signal $V_{in}$ is ground or "low", i.e., binary digital "0", the output voltage $V_{out}$ is equal to $V_o$ or "high", i.e., binary digital "1". Accordingly, the device 30 functions as an inverter logic element.

Figure 7:
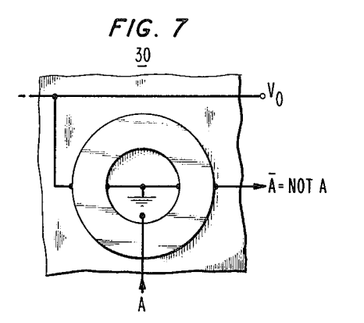
FIG. 7 is a symbolic logic representational diagram of the switching element shown in FIG. 4.

FIG. 7 symbolically shows the device 30 thus functioning as a logic element, with the supply voltage $V_o$, input logic signal A corresponding to the input signal voltage $V_{in}$ of FIG. 4, and with output NOT A (also denoted by $\overline{A}$) corresponding to the output voltage $V_{out}$, this output NOT $A = \overline{A}$ being the inversion or logical complement of the input; i.e., when input A is "0", output $\overline{A}$ (i.e., NOT A) is "1", and when input A is "1", output $\overline{A}$ (i.e., NOT A) is "0".

Figure 8:
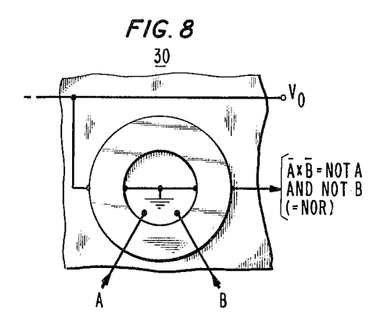
FIG. 8 is a symbolic logic diagram of the switching element shown in FIG. 4 used as a NOR gate in accordance with another embodiment of the invention.

FIG. 8 symbolically shows the device 30 with two independent inputs A and B, whereby the outputs is $\overline{A} \times \overline{B}$ (i.e., NOT A and NOT B, or simply NOR) because if and only if both inputs A and B are "low" or "0" then a current will percolate around the ring of the device 30 and thus produce an output which is "high" or "1". In other words, the NOR logic function is performed by the arrangement in FIG. 8.

Figure 9:
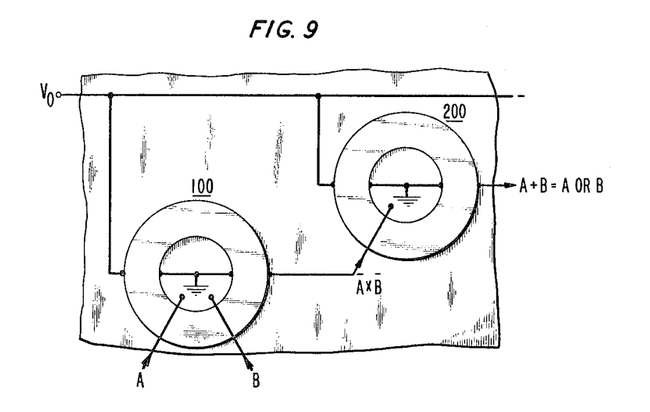
FIG. 9 is a symbolic logic diagram of a pair of switching elements connected for use as an OR gate in accordance with still another embodiment of the invention.

FIG. 9 shows an arrangement to arrive at the OR logic function, using two ring devices 100 and 200 each in accordance with the device 30 of FIG. 4 except for configuration of input(s). The device 100 has two independent inputs A and B, just as the device 30 in FIG. 8. The NOR output ($\overline{A} \times \overline{B}$) of this device 100 in fed as input to the device 200 which inverts it to A+B, that is, A OR B. Hence, the output of the two ring devices (A+B) will be "1" if and only if either A or B (or both) is "1".

Figure 10:
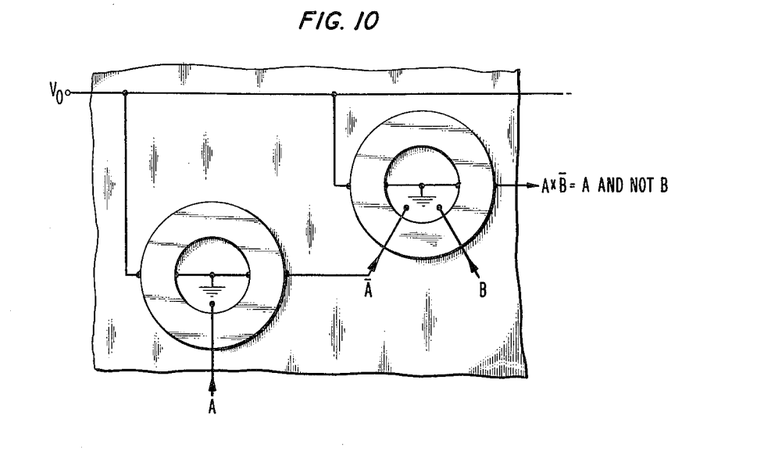
FIG. 10 is a symbolic logic diagram of a pair of switching elements connected for use as an AND NOT gate in accordance with yet another embodiment of the invntion.
Figure 11:
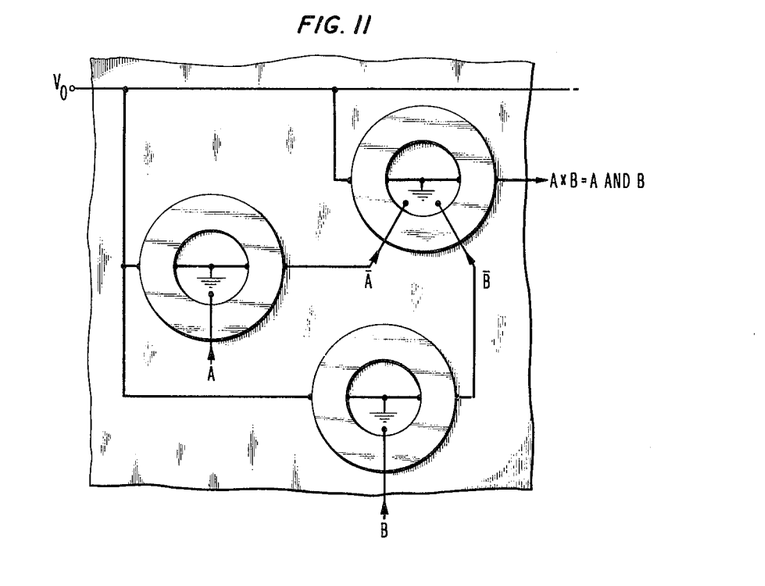
FIG. 11 is a symbolic logic diagram of a triplet of switching elements connected for use as an AND gate in accordance with still another embodiment of the invention.

FIG. 10 shows an arrangement to arrive at the AND NOT logic function, using two ring devices each according to the device 30 except for input configuration. Finally, FIG. 11 shows an arrangement to arrive at the AND function, using three such ring devices.

The switching device 30 (FIG. 4) can also be fabricated in silicon MOS (metal-oxide-semiconductor) technology, as shown in FIGS. 12-15. Here a silicon MOS switching device 300 includes a silicon body 301 serving as substrate for this device. The body 301 is essentially monocrystalline p-type silicon with a substantially uniform acceptor impurity concentration of the order of typically $10^{15}$ acceptor per cm$^3$. Upon a major planar surface 301.5 of the silicon body oriented (1,0,0) is a thermally grown silicon dioxide layer 301, typically in the range of about 500 to 1,000 Å thick. Localized diffused n+ zones 303, 304, 305, and 306 are located at the surface of the body 301 contiguous with apertures 313, 314, 315, and 316, respectively, through the oxide layer 301. These n+ zones are contacted by electrodes 323, 324, 325, and 326, respectively, typically of doped n+ polycrystalline silicon overlayed with aluminum. These n+ zones 323, 324, 325, and 326 (typically formed by arsenic impurity implantation and diffusion) serve the same respective functions in the device 300 (FIGS. 12 and 13) as do the n+ zones 35, 36, 45, and 46, respectively, in the device 30 (FIGS. 4 and 5). On the other hand, gate electrodes 323 and 326 serve similar respective gating functions in the device 300 as do the gate electrodes 61 and 64, respectively in the device 30; whereas the electrodes 324 and 325 of the device 300 are connected in common to ground during ordinary operation, that is, they are connected to substrate potential of the body 301; and these electrodes 324 and 325 thus function similarly as does the electrode 34 (FIG. 5) in the device 30.

An amorphous α-silicon layer 330 coated with a chemically vapor deposited layer of silicon dioxide 331 defines a ring structure for the device 300 similarly as do the gallium aluminum arsenide layers 32 and 33 for the device 30, except for an additional metallization electrode contact 327 (FIGS. 12 and 14) to the amorphous silicon layer 330 through an aperture 317 in the oxide layer 331. Typically this electrode 327 is of polycrystalline silicon overlayed with aluminum. Finally, electrodes 328 and 329 (FIGS. 12 and 15), also typically of polycrystalline silicon overlayed with aluminum, serve the same function as do electrodes 51 and 52 (FIGS. 4 and 6) in the device 30.

Figure 12:
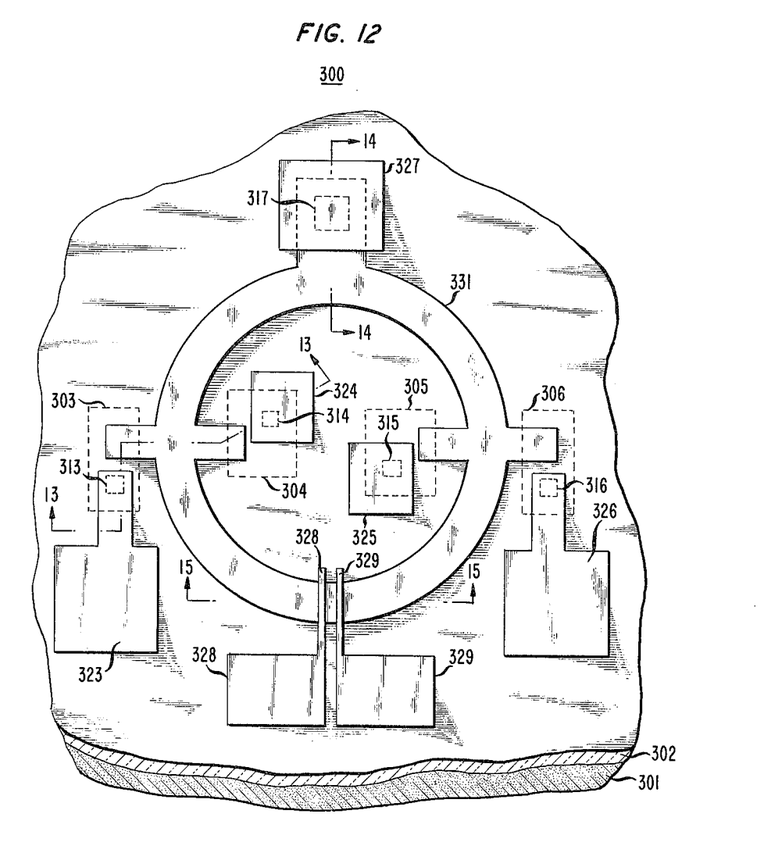
FIG. 12 is a top view diagram of a quantized Hall effect switching element, in accordance with another specific embodiment of the invention.
Figure 13:
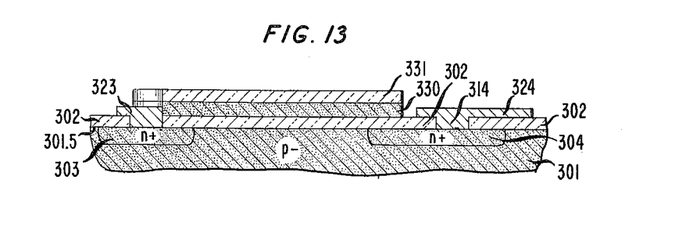
FIGS. 13-15 are cross sections of portions of the switching element shown in FIG. 12.
Figure 14:
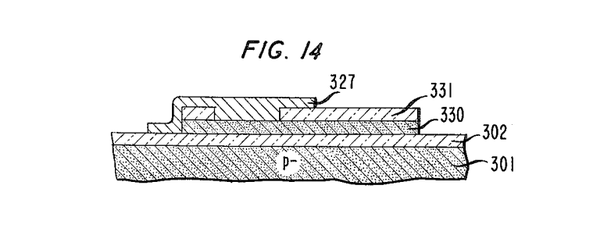
Figure 15:
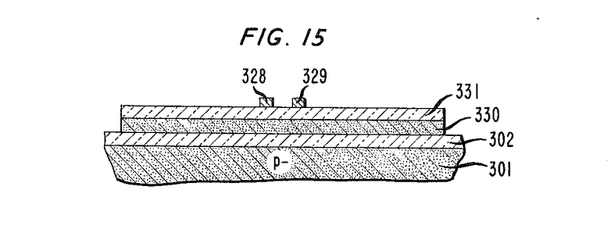

The purpose of the amorphous silicon layer 330 in the device 300 is to ensure the continued existence of an inversion layer in the underlying silicon. Accordingly, this amorphous silicon layer 330 is initially charged by applying at room temperature suitable potential to it by contacting the electrode 327 to a suitable voltage source for a sufficient charging time, typically about 5 volts for a time of the order of an hour. This charged amorphous silicon layer 330 will then remain charged at operating temperatures (about 4.2° K.) for a time typically of the order of years after disconnecting the voltage source. Because of the larger effective mass of silicon, however, the magnetic field should be about 3 times as large as in gallium arsenide for the same switching speed. The low field mobility of electrons in the inversion layer at operating temperature ordinarily should be at least about 10,000 cm$^2$/volt-second, for proper operation.

It should be understood that many similar devices 300 can be fabricated on a single silicon body 301 in accordance with integrated circuit techniques. The overall diameter of the ring shaped portion formed by the amorphous silicon layer can be as large as 1,000 micron or as small as a few micron, or less, depending upon the state of the fabrication art. Neighboring devices, as well as the interior portion of the ring, can be protected from spurious inversion layers by conventional implantation of channel stop p-type regions at the surface 301.5 of the silicon body 301, as well as by thick field oxide as known in the art of silicon integrated circuits.

Figure 16:
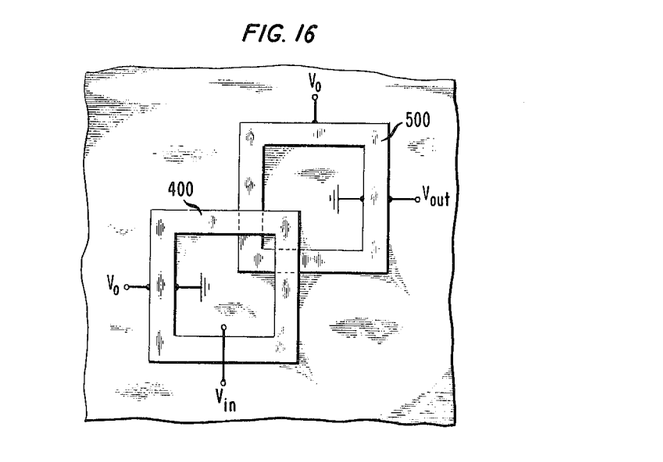
FIG. 16 is a top view diagram of a quantized Hall effect switching element, with an overlapping ring geometry, in accordance with yet another specific embodiment of the invention.

FIG. 16 shows a pair of square ring devices 400 and 500, each similar to (except for square ring configuration) the device 30 or 300, in an overlapping geometry, thereby avoiding the need for an added input line. The ring devices 400 and 500 can be circular as before, or can have any other convenient contour. Each of these rings is built at a slightly different level, i.e., different distance from the ground plane on the other side of the semiconductor body, so that a region of overlap is achieved. In this configuration, the presence vs. absence of percolating current in one of the rings affects the percolation in the other, in that only one of the rings can percolate at one time. Accordingly, the pair of ring devices 400 and 500 forms a bistable switching element. Moreover, several such ring devices can overlap a single such ring device, and a multiplicity of such ring devices can overlap in pairs, triplets, etc., in an array or pattern according to a desired logic function.

Figure 17:
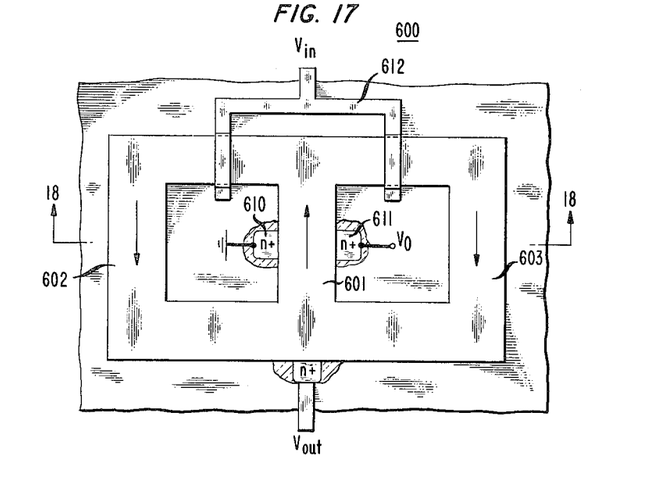
FIG. 17 is a top view diagram of a quantized Hall effect switching element, with a multiply connected ring geometry, in accordance with still another specific embodiment of the invention.
Figure 18:
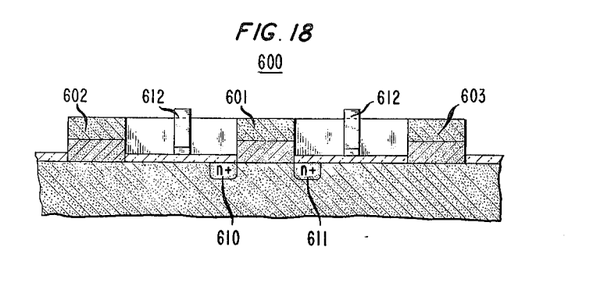
FIG. 18 is a cross section view of the element shown in FIG. 17.

FIGS. 17 and 18 illustrate a multiply connected ring device 600, comprising a central branch 601 and a pair of outer branches 602 and 603, together with source region 610 and drain region 611, as well as overlying control electrode 612 to which input voltage $V_{in}$ can be applied. When $V_{in}=0$, the current percolates in a first percolation state along the central branch 601 and the outer branch 602 but not the outer branch 603 (for a magnetic field directed into plane of drawing), and $V_{out}=V_o$. When $V_{in}$ goes through $V_o/2$ to $V_o$, all current percolates in a second percolation state along the central branch 601 and the outer branch 603 but not 602, and $V_{out}=0$. Thus, the output switches from $V_o$ to 0. Indeed, $V_{in}$ can be varied from a value slightly less than $V_o/2$ to a value slightly more than $V_o/2$ in order to switch the percolation from the outer branch 602 to the outer branch 603, and hence in order to switch $V_{out}$ from $V_o$ to 0. Thereby the energy required to switch the device 600 is reduced. Moreover, since there is no source to drain current when $V_{in}$ is greater than $V_o/2$, i.e., during the state of percolation where $V_{out}=0$, a substantial saving in energy consumption can therefore result.

Although the invention has been described in terms of specific embodiments, various modifications can be made without departing from the scope of the invention. For example, instead of the semiconductor epitaxial gallium aluminum arsenide structure shown in FIG. 5, the epitaxial structure disclosed in the aforementioned paper of D. C. Tsui and A. C. Gossard can be used. Indeed, any semiconductor structure can be used which furnishes an inversion layer that exhibits a zero resistance state and that can be shaped into an annular ring geometry. Accordingly, instead of inversion layers formed at heterojunction interfaces of gallium arsenide with gallium aluminum arsenide, other combinations of Group III-V or Group II-VI materials can be used, such as indium gallium arsenide with indium phosphide, tin telluride with lead selenide, or cadmium telluride with mercury cadmium telluride (for which the required magnetic field would be only about 1 Tesla or less). Moreover, one can also use the interface of silicon dioxide with silicon, where an inversion layer forms in the silicon that exhibits a zero resistance state, the required quantizing magnetic field, however, being somewhat larger (by a factor of about 2) for silicon than for gallium arsenide.

Also, instead of circular rings, other ring shapes can be used, such as rectangular or square rings (as indicated, for example, by the shapes of the devices illustrated in FIGS. 16 and 17).

Appendix

Workers in the art have found that the quantized values $r_1$, $r_2$, $r_3$, etc., of (transverse) Hall resistivity $\rho_{xy}/t$ satisfied:

$$r_1 = h/2e^2$$

$$r_2 = h/4e^2$$

$$r_3 = h/6e^2 \text{ etc.}$$

or, in general:

$$r_i = h/2ie^2 \tag{6}$$

where h is Planck's constant, e is the charge of an electron, and i is an integer (i = 1, 2, 3, . . . ).

The interpretation or explanation of this quantized phenomenon of Hall resistivity has been given by various workers in terms of the existence of quantized energy levels in a uniform magnetic field, so-called Landau energy levels, produced in response to the application of the magnetic field B. These levels and their associated quantized electronic states are described more fully, for example, in L. D. Landau and E. M. Lifshitz, *Quantum Mechanics, Non-Relativistic Theory*, (Third Edition, 1977), pp. 453–458. In the special case of a low temperature T of operation (ordinarily well below liquid nitrogen temperature) and a small thickness (in the z-direction) of the region of electron confinement—as afforded by an inversion layer, for example, typically only about 50 Å thick—the quantum states corresponding to Landau levels of differing electron momenta $p_z$ in the z-direction are separated by energies which are so much greater than kT (k=Boltzmann contact) that only the quantum states associated with Landau levels of lowest energy are ever occupied at that low temperature of operation; all electronic states at levels corresponding to higher values of momentum $p_z$, and hence of higher energy, remain completely unoccupied during operation. Thus, for all practical purposes, no electronic transitions due to thermal effects can occur through any changes in momentum component $p_z$; therefore, motion of the electrons in the z-direction is of no importance (is "frozen out") during operation, and the resulting system of electrons in the inversion layer behaves as a two-dimensional (x-y) electron system or "2-D electron gas." On the other hand, the electronic motion in the x-y plane corresponds to quantized Landau levels, named after their discoverer, L. D. Landau. The levels are characterized by quantized energy $E_n$ satisfying:

$$E_n = (n + \tfrac{1}{2}) h f_c \tag{7}$$

where n=0, 1, 2, 3, ..., and is called the energy "quantum number"; and where $f_c$ is the "cyclotron frequency":

$$2\pi f_c = eB/m \tag{8}$$

Thus, neighboring Landau levels ($E_n$, $E_{n+1}$) are separated by energy $hf_c$.

Physically, $f_c$ is the frequency of the uniform circular motion of a free electron of charge e and of effective mass m in a uniform magnetic field B. For electrons in solids, this effective mass m is the so-called reduced mass, typically less than the free electron mass by a factor of about 0.07 in gallium arsenide. It should be noted that for each value of (integer) quantum number n, the corresponding Landau energy level $E_n$ is very "degenerate"; that is, to each value of energy $E_n$, there are very many quantum states with this same value of energy. More specifically, for given $E_n$ (with $p_z$ in its lowest state), the number of states $N_n$ is equal to:

$$N_n = 2eBS/h \tag{9}$$

where S is the area (wL) in the x-y plane within which the two-dimensional motion of the electrons in a uniform magnetic field B (in the z-direction) is confined, for example, by the inversion layer. The factor of 2 is caused by the two possible spins of an electron. All effects, if any, due to spin-splitting of levels will be neglected for clarity of presentation; such splitting would not change the results qualitatively. Note that $N_n$ is independent of n; that is, each level contains the same number of states. On the other hand, at low temperatures T for which kT is small compared with $hf_c$—i.e., the thermal energy is small compared with the separation of neighboring Landau levels—the separation $hf_c$ between neighboring Landau levels is then large compared with kT, so that thermal agitation or scattering effects are not sufficient to induce electronic transitions between energy levels of differing energy—that is, for example, between successive Landau energy $E_n$ and $E_{n+1}$. Thus, for a given value of $f_c$ and hence for a given applied magnetic field B, if the Fermi level $E_F$ falls well between (i.e., at least several kT from both $E_n$ and $E_{n+1}$) the two successive levels $E_n$ and $E_{n+1}$, then thermal scattering effects are not strong enough to induce electronic transitions between these two levels or, a fortiori, between either of these levels and any others. Accordingly, in such a situation there is no significant electron scattering, and hence the longitudinal ("parallel") electrical conductivity $\sigma_L$ (but not the transverse conductivity $\sigma_T$) vanishes, where $\sigma_L$ symmetric case is defined in terms of current density ($j_x$, $j_y$) by the relationships:

$$j_x = \sigma_L E_x + \sigma_T E_y$$

$$j_y = -\sigma_T E_x + \sigma_L E_y \tag{10}$$

The vanishing of $\sigma_L$ thus immediately leads to simpler relationships of current density to electric field:

$$j_x = \sigma_T E_y$$

$$j_y = -94_T E_x \tag{11}$$

On the other hand, in the situation (FIG. 2) where $j_y$ itself vanishes, i.e., $j_y=0$, it then follows that $E_x$ also vanishes, i.e., $E_x=0$, even though $j_x$ does not necessarily vanish. Accordingly, in this situation where $\sigma_L$ vanishes, the voltage drop, $V=E_x l$, will also vanish; and also $\rho_{xx} = E_x/j_x$ vanishes, i.e., $\sigma_{xx}=0$. Summarizing the conditions in FIG. 2 in the situation where the Fermi level falls well between two successive Landau levels:

$$\sigma_L = 0$$

$$j_y = 0$$

$$E_x = 0$$

$$\rho_{xx} = 0 \tag{12}$$

Accordingly, in this situation where the longitudinal conductivity vanishes ($\sigma_L = 0$), since also $E_x = 0$ the power dissipation, $P = j_x E_x + j_y E_y$, will also vanish, even in the presence of non-vanishing current density $j_x$ in the x-direction.

By varying the applied magnetic field B, a Landau level, such as $E_n$, can be made to approximate the Fermi level, that is, to within kT or less; under the influence of that field B, the longitudinal resistivity $\rho_{xx}$ no longer vanishes.

On the other hand, under the influence of a magnetic field B for which the longitudinal resistivity vanishes, the (two-dimensional) electron system is said to be in a "zero-resistance state." The allowed quantized values $r_1, r_2, r_3, \ldots$ of transverse resistivity $\rho_{xy}$ in these zero-resistance states can be theoretically derived from the following considerations. The lowest Landau energy level has an energy $E_o$ given by $E_o = (\tfrac{1}{2})hf_c = heB/4\pi m$. At a fixed temperature T, starting with a magnetic field B so large that even this lowest Landau level $E_o$ lies above the Fermi level $E_F$ by more than kT, and then reducing the field B until this lowest Landau level lies below the Fermi level $E_F$ by more than kT (but the next lowest Landau level, $E_1 = (3/2)hf_c$, does not lie below the Fermi level $E_F$), then every one of the very many electronic quantum states associated with the level $E_o$ is filled, and thus each such state can contribute two electrons (two spins) for transporting charge through the body and thus for contributing to the current; thus, from Equation (9), a total of $N=2eBS/h$ electrons are supplied by all these states of Landau energy level $E_o$ to the electrical conduction capability of the body.

Figure 19:
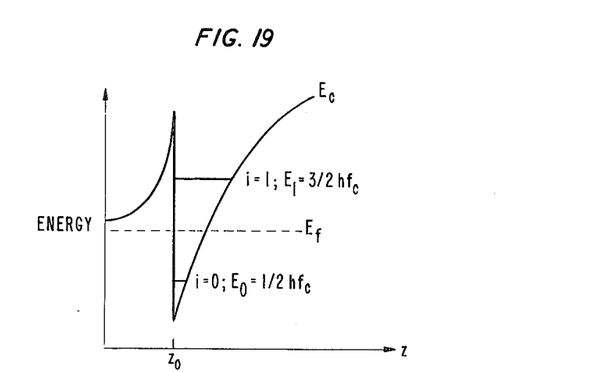
FIG. 19 is a graphic plot of conduction band energy versus distance, useful in understanding the invention.

This situation, where the Fermi level falls (approximately midway) between the Landau energy level $E_o=(\frac{1}{2})hf_c$ and $E_1=(3/2)hf_c$, is illustrated in FIG. 19. Here the bottom of the conduction band $E_c$ is plotted against distance z in the semiconductor body having a heterojunction at $z=z_o$ (where an inversion layer occurs).

In order for a zero resistance state to exist, for example, with the Fermi level following midway between the Landau levels $E_o=(\frac{1}{2})hf_c$ and $E_1=(3/2)hf_c$, the average thermal energy kT (k=Boltzmann's constant, T=temperature) must be considerably less than the energy separation of the Fermi level from either level $E_o$ or $E_1$. Thus, for such a zero resistance state to exist, kT must be considerably less than $\frac{1}{2}hf_c=heB/4\pi m$; or, in other words, for an effective mass m of about 0.07 electronic masses as in gallium arsenide, the temperature T must be considerably less than about 9.5° K./Tesla. For a magnetic field B of about 9 Tesla, the temperature T must thus be considerably less than about 85° K. for a zero resistance state to exist.

In the zero resistance state (FIG. 18), from elementary considerations, the current I (in the x-direction) due to the N electrons in the filled level $E_o$ is given by:

$$I=(N/St)ev_x wt \qquad (13)$$

where $\bar{v}_x$ is the average drift velocity in the x-direction of the electrons in the (degenerate) Landau level $E_o$. Since $N=2eBS/h$, it follows that the resulting electrical current I is given by:

$$I=2e^2 B v_x w/h \qquad (14)$$

Due to the electron drift in the x-direction (FIG. 2), a magnetic force $e\bar{v}_x B$ drives the electrons to the bottom edge 14 of the bar 10, thereby resulting in an accumulation of electrons thereat and thus also resulting in a static electric field $E_y$ parallel to the y-axis. Equilibrium, as is well known, requires vanishing of the average Lorentz force in the y-direction, $e(E_y-\bar{v}_x B)$, so that $$v_x=E_y/B \qquad (15)$$

On the other hand, the Hall voltage $V_H$ is given by:

$$V_H=E_y w, \qquad (16)$$

so that the average drift velocity (in the x-direction) $\bar{v}_x$ is given by:

$$v_x=V_H/wB \qquad (17)$$

Accordingly, the current I is given by:

$$I=2e^2 V_H/h \qquad (18)$$

Thus it follows that the ratio of $I_k$ to $V_H$ is given by:

$$I/V_H=2e^2/h \qquad (19)$$

Accordingly, the electrons of the lowest Landau level $E_o$ contribute a conductance equal to $2e^2/h$. Similarly, by decreasing the magnetic field further so that the next lowest Landau level $E_1=3/2hf_c$ falls below the Fermi level (but the level $E_2=5/2hf_c$ does not), it follows that the conductance then increases (by virtue of the filling of the Landau level $E_1$ in addition to $E_o$) by the same amount $2e^2/h$, and thus the total conductance becomes $4e^2/h$. Thus, in general, if the Fermi level falls between the n'th and (n+1)'th Landau level, the ratio of the current I to Hall voltage $V_H$ will be given by:

$$I/V_H=2(n+1)e^2/h \qquad (20)$$

Thus, the reciprocal ratio will be given by:

$$V_H/I=h/2(n+1)e^2 \qquad (21)$$

Accordingly, the quantized values of transverse resistivity ($r_i$; i=1, 2, 3, ...) will be given by Equation (5), with $i=n+1$. In addition, the current I is thus seen, for any given quantized resistance state, to be independent of the width of the bar 10 for a given Hall voltage $V_H$, this current I being dependent only upon the number (n+1) of (completely) filled Landau levels and upon the Hall voltage $V_H$ itself.

It is believed that in the presence of the electric field $E_y$ in the bar 10, the wave function of each of the (many) quantum states in a given (degenerate) Landau level $E_n$ has a (ordinarily slightly) different energy (due to the electrical potential $eE_y Y$) and has a wave function in the form, as a function of x, of an imaginary exponential (plane wave propagating in the x-direction) and, as a function of y, the form of the k'th eigenfunction of a linear harmonic oscillator centered at $y_o$, with the allowed values of $y_o$ running between those corresponding to the top edge 13 and the bottom edge 14 of the rod 10 in steps $\delta y_o$. Thus the number of states $N_n$ (two spins for each $y_o$) for a given level $E_n$ is now given by:

$$N_n=2w/\delta y_o \qquad (22)$$

But, $N_n$ is also given by Equation (5) as $2eBS/h$; so that:

$$2w/\delta y_o=2eBwL/h \qquad (23)$$

and hence:

$$\delta y_o=h/eBL \qquad (24)$$

It is convenient to introduce the Landau length $a_H$, that is, a distance measure of the extent or dispersion (region of appreciable value different from zero) of the wave function in the y-direction for level $E_o$:

$$a_H^2=h/(2\pi m)(2\pi f c)=h/2\pi eB \qquad (25)$$

as given, for example, in L. D. Landau and E. M. Lifshitz, *Quantum Mechanics: Non-Relativistic Theory* (Third Edition, London, 1977), p. 457. It is then seen that $eB=h/2\pi a_H^2$ and that therefore:

$$\delta y_o=2\pi a_H^2/L \qquad (26)$$

For example, with a magnetic field of 10 Tesla, $a_H$ is about 80 Å. Accordingly, with this field and for a length L of the order of 10 micron, $\delta y_o$ is then of the order of 0.4 Å; that is, successive electron paths or orbits are separated from each other by only 0.4 Å in the y-direction, the term "path" or "orbit" referring to regions of widths of the order of $a_H$ (i.e., $\delta y_o$ is of the order of 80 Å in width in this example).

Each of these electron paths is believed to be centered at and to follow along a separate equipotential line in the "two-dimensional" electron system defined by the inversion layer. These equipotential surfaces are determined, at least in part, by the field $E_y$ caused by the surface distribution of charge on the edges of the ring under the influence of the magnetic field acting on the moving electrons.

It is believed that so long as even but a single equipotential line extends across the entire length of the bar 10 from one electrode contact to the other, with sufficient distance margin on either side to accommodate a Landau level orbit (i.e., the equipotential is separated by at least a distance of the order of $a_H$ from either edge of the bar 10), then a macroscopic number (of order $L/a_H$) of orbits can percolate (uninterrupted) around the ring and thus the zero resistance state persists even in the presence of local perturbations of potential in the bar (due to such causes as, for example, random impurities therein). It is further believed that any and all such percolating orbits are destroyed by an added sufficient electrostatic field of the gate electrode, and hence that the zero resistance state is destroyed by sufficient input signal voltage applied to the gate electrode.

It should be noted that when sufficiently even lower temperatures are used, the gyromagnetic electron spin energy can become significant in splitting can Landau level into two separate levels and thereby introducing a factor of $\frac{1}{2}$ in Equation (20), for example.

What is claimed is:

1. A quantized Hall effect switching element comprising means for establishing and gate means for interrupting quantum percolation of electrical current, said means for establishing including:
   a pair of solid layers physically contacting each other at an interface having a closed ring geometry configuration at which during operation an inversion layer forms, said inversion layer having a zero resistance state when subjected to a predetermined magnetic field at a predetermined temperature, said solid layers comprising a first solid semiconductor layer upon which another solid layer has been grown, a pn junction in the first solid layer contiguous with an outer edge of the ring.

2. An element according to claim 1 further comprising:
   first electrical access means to a first portion of the loop for detecting the interrupting, whereby an output voltage developed at said first access means switches in response to an input signal applied to said gate means.

3. An element according to claim 1 or 2 in which said means for establishing further includes:
   second electrical access means to a second portion of the loop.

4. An element according to claim 1 or 2 in which said gate means comprises a gate electrode and in which said means for establishing further includes low temperature means and magnetic field means for establishing, respectively, a temperature and a magnetic field suitable for said quantized Hall effect.

5. A logic device including first and second switching elements, the first element and the second element in accordance with claim 1 in which the gate means of the second element is connected to the first electrical access means of the first element, whereby the presence versus absence of said percolation in the second element is a logical function of signal applied to the gate means of the first element.

6. A logic device including mutually overlapping first and second elements each according to claim 1, whereby the presence versus absence of said percolation of current in the second element is a logical function of the presence versus absence of said percolation of current in the first element.

7. A switching element comprising:
   (a) a pair of solid layers having an interface therebetween at which during operation is formed an inversion layer in a ring configuration exhibiting a zero resistance state, completely around the ring, at a predetermined temperature under the influence of a magnetic field sufficient to produce the zero resistance state in said inversion layer, said solid layers comprising a first solid semiconductor layer upon which another solid layer has been grown, a pn junction in the first solid layer located at an outer edge of the ring;
   (b) a first external contact to a first portion of the ring for injecting electrical charges into the inversion layer in order to establish an electrical current percolating around the ring in said zero resistance state;
   (c) a second electrical contact to a second portion, separated from said first portion, of the ring for detecting the presence versus absence of said electrical current; and
   (d) gate electrode means, proximate said inversion layer at a third portion thereof, for interrupting said zero resistance state and correspondingly modulating said electrical current, in response to a voltage applied to said gate electrode means, without interrupting said inversion layer, whereby the voltage at said second electrical contact is correspondingly modulated.

8. A switching element formed by a two-dimensional electron gas in an inversion layer, in a ring geometry, the inversion layer situated at an interface between a pair of solid layers, said solid layers comprising a first solid semiconductor layer upon which another solid layer has been grown, a pn junction in the first solid layer located at an outer edge of the ring, having a first pair of spaced apart terminals contacting opposing first portions of, respectively, inner and outer surfaces of the ring to establish a voltage across said terminals and hence across said first portions of the inner and outer surfaces, said inversion layer being subjected to a sufficient magnetic field and being maintained at a sufficiently low temperature that electrons can percolate around the ring in a zero resistance state, whereby an output voltage appears across a second pair of terminals contacting opposing second portions, respectively, of said inner and outer surfaces removed from said first portions and said output voltage disappears if and only if a sufficient voltage is applied to a gate electrode insulated from the inversion layer and located in a neighborhood of said inversion layer which is removed from said first and second portions.

9. An element according to claim 1, 2, 7, or 8 further including means for applying said magnetic field.

10. An element according to claim 1, 2, 7, or 8 further including means for maintaining said element at said predetermined temperature.

11. An element according to claim 1, 2, 7, or 8 in which said solid layers are both Group III-V materials.

12. An element according to claim 11 in which said solid layers are gallium arsenide and gallium aluminum arsenide.

13. An element according to claim 1, 2, 7, or 8 in which said solid layers are a silicon body and a silicon dioxide layer.

14. An element according to claim 13 further comprising a layer of amorphous silicon located on silicon dioxide layer.

* * * * *